United States Patent
Roohparvar

(10) Patent No.: US 6,529,417 B2
(45) Date of Patent: Mar. 4, 2003

(54) SOURCE REGULATION CIRCUIT FOR FLASH MEMORY ERASURE

(75) Inventor: Frankie Fariborz Roohparvar, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 115 days.

(21) Appl. No.: 09/821,243

(22) Filed: Mar. 29, 2001

(65) Prior Publication Data

US 2001/0050864 A1 Dec. 13, 2001

Related U.S. Application Data

(62) Division of application No. 09/251,035, filed on Feb. 18, 1999, now Pat. No. 6,222,770, which is a division of application No. 08/844,191, filed on Apr. 18, 1997, now Pat. No. 6,097,632.

(51) Int. Cl.[7] .............................................. G11C 16/16
(52) U.S. Cl. ........................ 365/185.33; 365/185.29; 365/185.19; 365/185.2
(58) Field of Search ..................... 365/185.29, 185.33, 365/185.19, 185.2

(56) References Cited

U.S. PATENT DOCUMENTS

| 5,315,547 A | 5/1994 | Shoji et al. ............ 365/185.12 |
| 5,568,426 A | 10/1996 | Roohparvar et al. ... 365/185.22 |
| 5,619,453 A | 4/1997 | Roohparvar et al. ... 365/185.33 |
| 5,627,784 A | 5/1997 | Roohparvar ........... 365/189.01 |
| 5,636,166 A | 6/1997 | Roohparvar ................ 365/194 |
| 5,802,502 A | 9/1998 | Tang et al. ............ 365/185.29 |

FOREIGN PATENT DOCUMENTS

| DE | 196 28 022 A1 | * | 1/1998 | ............. H02J/7/00 |
| GB | 2 332 960 A | * | 7/1999 | .......... H04N/3/185 |

* cited by examiner

Primary Examiner—Andrew Q. Tran
(74) Attorney, Agent, or Firm—Schwegman, Lundberg, Woessner & Kluth, P.A.

(57) ABSTRACT

A flash memory is described which uses floating gate transistors as memory cells. A source regulation circuit within the memory is described which generates a ramped reference voltage signal. The ramped reference voltage signal is applied to a differential amplifier connected to a reference circuit to produce a ramped erase voltage signal. The ramped erase voltage signal is then applied to sources of the memory cells during an erase operation. Both analog and digital circuits are described for generating the ramped reference voltage signal.

20 Claims, 8 Drawing Sheets

SOURCE REGULATION CIRCUIT FOR FLASH MEMORY ERASURE

This application is a Divisional of U.S. Ser. No. 09/251,035, filed Feb. 18, 1999, now U.S. Pat. No. 6,222,770, which is a Divisional of U.S. Ser. No. 08/844,191, filed Apr. 18, 1997, now issued as U.S. Pat. No. 6,097,632 on Aug. 1, 2000.

THE FIELD OF THE INVENTION

The present invention relates generally to non-volatile memory devices and, in particular, the present invention relates to erase operations of flash memories.

BACKGROUND OF THE INVENTION

A flash memory device is a non-volatile memory, derived from erasable programmable read-only memory (EPROM) and electrically-erasable programmable read-only memory (EEPROM). Flash memory is being increasingly used to store execution codes and data in portable electronic products, such as computer systems.

A typical flash memory comprises a memory array having a large number of memory cells arranged in blocks. Each of the memory cells is fabricated as a field-effect transistor having a control gate and a floating gate. The floating gate is capable of holding a charge, and is separated, by a layer of thin oxide, from source and drain regions contained in a substrate. Each of the memory cells can be electrically programmed (charged) by injecting electrons from the drain region through the oxide layer onto the floating gate. The charge can be removed from the floating gate by tunneling the electrons to the source through the oxide layer during an erase operation. Thus the data in a memory cell is determined by the presence or absence of a charge on the floating gate.

Flash memories have a typical operating voltage of about 5 volts. A high voltage, however, is usually required for programming and erase operations in a flash memory. This high voltage (Vpp) is in the range of the 10 to 13 volts, but can be higher. During a programming operation, electrons are injected onto the floating gate by applying the high voltage (Vpp) to the control gate and about one-half Vpp to the drain region while the source region is grounded. Electron tunneling from the floating gate during an erase operation is accomplished by applying Vpp to the source region, connecting the control gate to ground potential and leaving the drain region electrically unconnected or floating.

As with any device, a flash memory has a limited useful life. The useful s life of a flash memory is defined by its cycling specification. A flash memory's cycling specification is the maximum number of program/erase cycles which a flash memory is expected to perform without loss of preset margin. This number is normally about 100,000 cycles. When a specific flash memory exceeds the specified cycling number, the device could suffer from undesirable performance, or even permanent damage. The oxide layer between the floating gate and the substrate tends to be the limiting element in increasing memory life. The oxide layer is an insulator which is used to transport carriers (electrons or holes) to the floating gates to change data states. This transportation is the greatest cause of degraded performance. The quality of the oxide used and how well the oxide is treated during program and erase cycles are important factors in determining the cycling specification.

During an erase cycle, the high voltage (Vpp) applied across the oxide causes tunneling of electrons from the floating gate to the source. At the same time, the high voltage could cause holes from the source to be injected into the oxide. These holes can degrade the performance of the oxide by creating a leakage path in the oxide between the source and the floating gate.

Since the oxide is the barrier for electrons traveling to and from the floating gate, the charging and discharging current of a memory cell depends on the voltage applied across the oxide layer, $I=C(dv/dt)$. Therefore, the voltage applied across the oxide has a direct effect on electron tunneling and is the main cause of undesirable hole injection into the oxide during an erase operation. To improve the durability of the oxide and the reliability of the flash memory, there is a need for a method and circuit to regulate the voltage applied across the oxide of the memory cell during an erase operation.

SUMMARY OF THE INVENTION

The present invention describes a circuit and method for improving the reliability of a flash memory by regulating the voltage applying to the source of memory cells during an erase operation. By ramping the voltage applied to the source, the invention allows electron tunneling to occur while reducing the current through the floating gate oxide layer.

In particular, the present invention describes a memory comprising an array of floating gate memory cell transistors, and a control circuit. The control circuit, which by applying appropriate voltages to the array of floating gate memory cells, causes the cells to store a charge on the floating gate memory cell transistors during a programming operation, and remove the stored charge from the floating gate memory cell transistors during an erase operation. The memory also comprises a source regulation circuit for applying a ramped voltage signal to sources of the floating gate memory cell transistors during an erase operation.

In another embodiment, a flash memory is described which comprises a memory array of floating gate memory cell transistors, a differential amplifier having first and second inputs and an output, and a voltage divider circuit connected to the first input of the differential amplifier for providing a variable reference voltage. A voltage ramp generator is provided which has an output connected to the second input of the differential amplifier for providing a ramped reference voltage signal. An output circuit is connected to the output of the differential amplifier for providing a ramped voltage signal to be coupled to sources of the floating gate memory cell transistors during an erase operation.

In yet another embodiment, a method of erasing a floating gate memory cell transistor is described. The method comprises the steps of coupling a control gate of the floating gate memory cell transistor to a low voltage potential, and applying a ramped voltage signal to a source of the floating gate memory cell.

A method is described for improving reliability of a flash memory having memory cells formed as transistors. The memory cells have a floating gate separated from a channel region by a layer of gate oxide. The method comprises the steps of coupling a control gate of the memory cell to a low voltage potential, generating a pulsed ramped voltage signal, and applying the pulsed ramped voltage signal to a source of the memory cell.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is therefore, not to be taken in limiting sense, and the scope of the invention is defined by the appended claims.

Before the present invention is described in detail, the construction and operation of a basic floating gate memory cell is described with reference to FIGS. 1A, 1B and 1C.

Figure 1A:
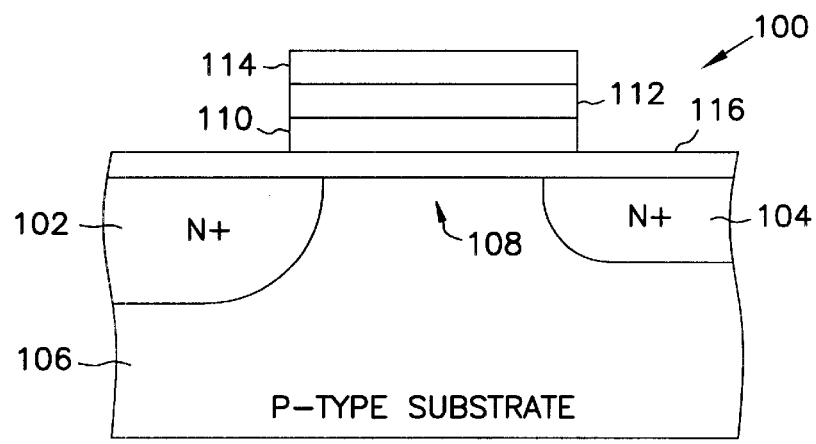
FIG. 1A is a cross-sectional view of a prior art memory cell.

FIG. 1A is a cross-sectional view of a typical floating gate memory cell used in flash memories. Memory cell 100 comprises a source region 102 and a drain region 104. Source 102 and drain 104 are constructed from N+type regions formed in a P-type semiconductor substrate 106. Source 102 and drain 104 are separated by a channel region 108. Memory cell 100 further includes a floating gate 110 formed by a first polysilicon (poly) layer, and a control gate 114 formed by a second poly layer. Floating gate 110 is isolated from control gate 114 by an interpoly dielectric layer 112 and from channel region 108 by a thin gate oxide layer 116. The gate oxide layers typically has a thickness of approximately 100 angstrom.

Figure 1B:
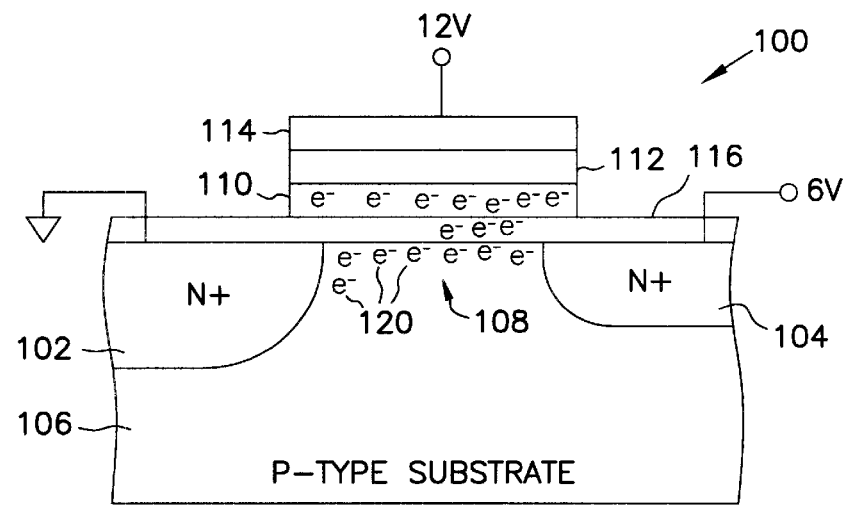
FIG. 1B is the memory cell of FIG. 1A during a programming operation.

FIG. 1B is the memory cell of FIG. 1A during a programming operation. To program the memory cell to store a charge, a positive programming voltage of about 12 volts is applied to control gate 114. This positive programming voltage attracts electrons 120 from P-type substrate 106 and causes them to accumulate toward the surface of channel region 108. The drain 104 voltage is increased to about 6 volts, and source 102 is coupled to ground. As the drain-to-source voltage increases, electrons 120 begins to flow from source 102 to drain 104 via channel region 108. Electrons 120 acquire substantially large kinetic energy and are referred to as hot electrons.

The voltage difference between control gate 114 and drain 104 creates an electric field through oxide layer 116, this electric field attracts the hot electrons and accelerates them towards floating gate 110. Floating gate 110 starts to trap and accumulate the hot electrons, beginning the charging process. As the charge on the floating gate increases, the electric field through oxide layer 116 decreases and eventually loses it capability of attracting any more of the hot electrons. At this point, floating gate 110 is fully charged. The charged floating gate 110 raises the memory cell's threshold voltage (Vt) above logic 1 voltage. Thus, when control gate 114 is brought to a logic 1 during a read operation, the memory cell will barely turn on. As known to those skilled in the art, sense amplifiers are typically used in a memory to detect and amplify the state of the memory cell.

Figure 1C:
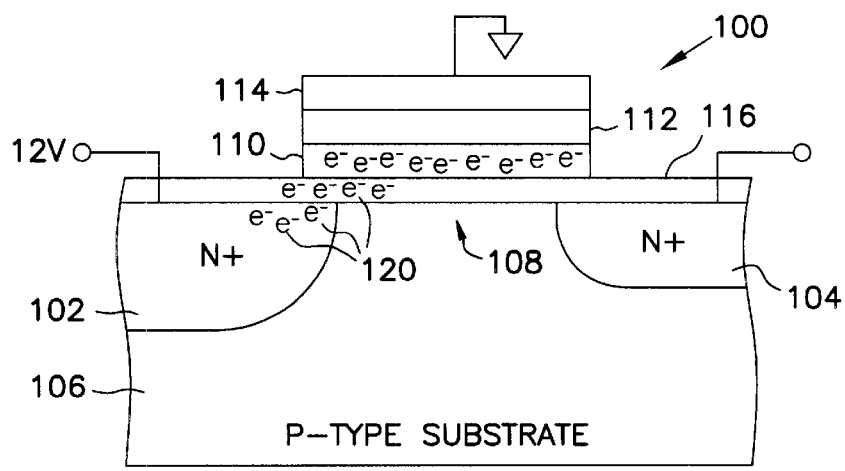
FIG. 1C is the memory cell of FIG. 1B during an erase operation.

FIG. 1C is the memory cell of FIG. 1B during an erase operation. The memory cell is erased by discharging the floating gate. To erase the memory cell, a positive voltage of about 12 volts is applied to source 102 while control gate 114 is coupled to ground and drain 104 is left unconnected, electrically floating. With a higher positive voltage at source 102, negatively-charged hot electrons 120 are attracted and tunneled to source 102 through the thin gate oxide layer 116. The tunneling is stopped when the floating gate is discharged. To avoid over exposure, the voltage applied to the source is typically applied in short pulses having equal duration and magnitude. That is, if one memory cell in a block does not fully erase during an erase operation, it is preferred to use short erase pulses to erase that memory cell. The short erase pulse prevents over erasing memory cells in the block that are already erased. The lack of negative charge on floating gate 110 returns the memory cell's threshold voltage below logic 1 voltage. Thus, when a voltage on control gate 114 is brought to a logic 1 during a read operation, the memory cell will turn on. Again, sense amplifiers are used to output the appropriate state of the memory cell.

As mentioned previously, the voltage applied across the oxide between the floating gate and the source region effects the durability of the gate oxide layer and the reliability of the memory cell. The present invention provides a method and circuit to regulate the voltage applied to the source of a floating gate memory cell during an erase operation.

Figure 2:
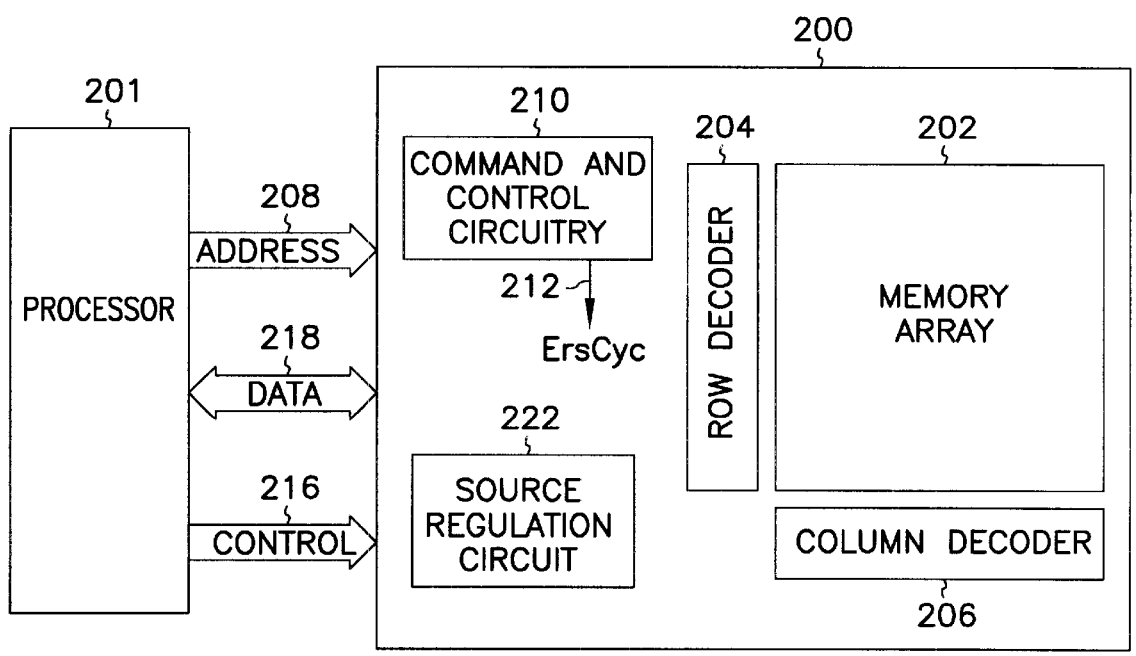
FIG. 2 is a simplified block diagram of a flash memory incorporating the present invention.

FIG. 2 is a simplified block diagram of a typical system incorporating the present invention. The system includes a processor 201 and a memory 200. Memory 200 comprises a memory array 202 having floating gate memory cells. A row decoder 204 and a column decoder 206 are designed to decode and select addresses provided on address lines 208 to access appropriate memory cells in the array. Command and control circuitry 210 is designed to control the process of storing and removing a charge on the floating gate memory cells. Circuitry 210 also controls the operation of memory 200 in response to incoming command and control signals on control lines 216 from the processor 201. Circuitry 210 produces an Erase Enable signal (ErsCyc) 212 used during an erase operation. Communication lines 218 are used for bidirectional data communication between the processor and the memory. Source regulation circuit 222 is provided to produce a controlled voltage signal applied to the sources of the floating gate memory cells during an erase operation, as explained below. It will be appreciated by those skilled in the art that the memory of FIG. 2 has been simplified for the purpose of illustrating the present invention and is not intended to be a complete description of a flash memory.

Figure 3A:
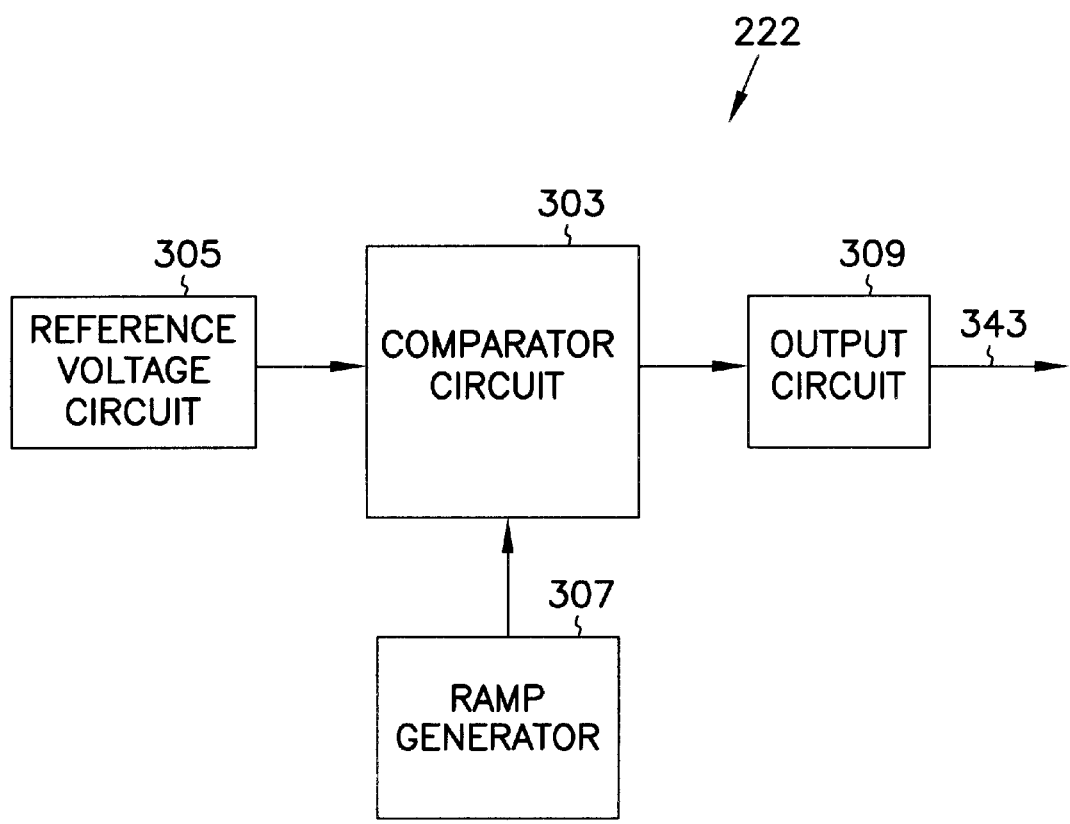
FIG. 3A is a block diagram of a source regulation circuit.

To increase the useable life of floating gate memory cells used in flash memories, the source voltage is controlled in a manner which reduces stress placed on the gate oxide layer. The source voltage, therefore, is slowly ramped during the erase operation. The source voltage is preferably ramped using a series of pulses which increase in amplitude. To generate these pulses a source regulation circuit 222 is provided in memory 200 of the system shown in FIG. 2. As illustrated in FIG. 3A, a ramp generator circuit is provided as part of the source regulation circuit. Two embodiments of the generator circuit are described with reference to FIGS. 4 and 6. The source regulation circuit 222 includes a reference voltage circuit 305 for providing a reference voltage signal, and a comparator circuit 303 for comparing the reference voltage signal and a ramped voltage signal provided by a generator circuit 307. The comparator circuit activates an output circuit 309 in response to the reference and ramped voltages. The output circuit generates a ramped erase signal at output 311 which is used to erase memory cells.

Figure 3B:
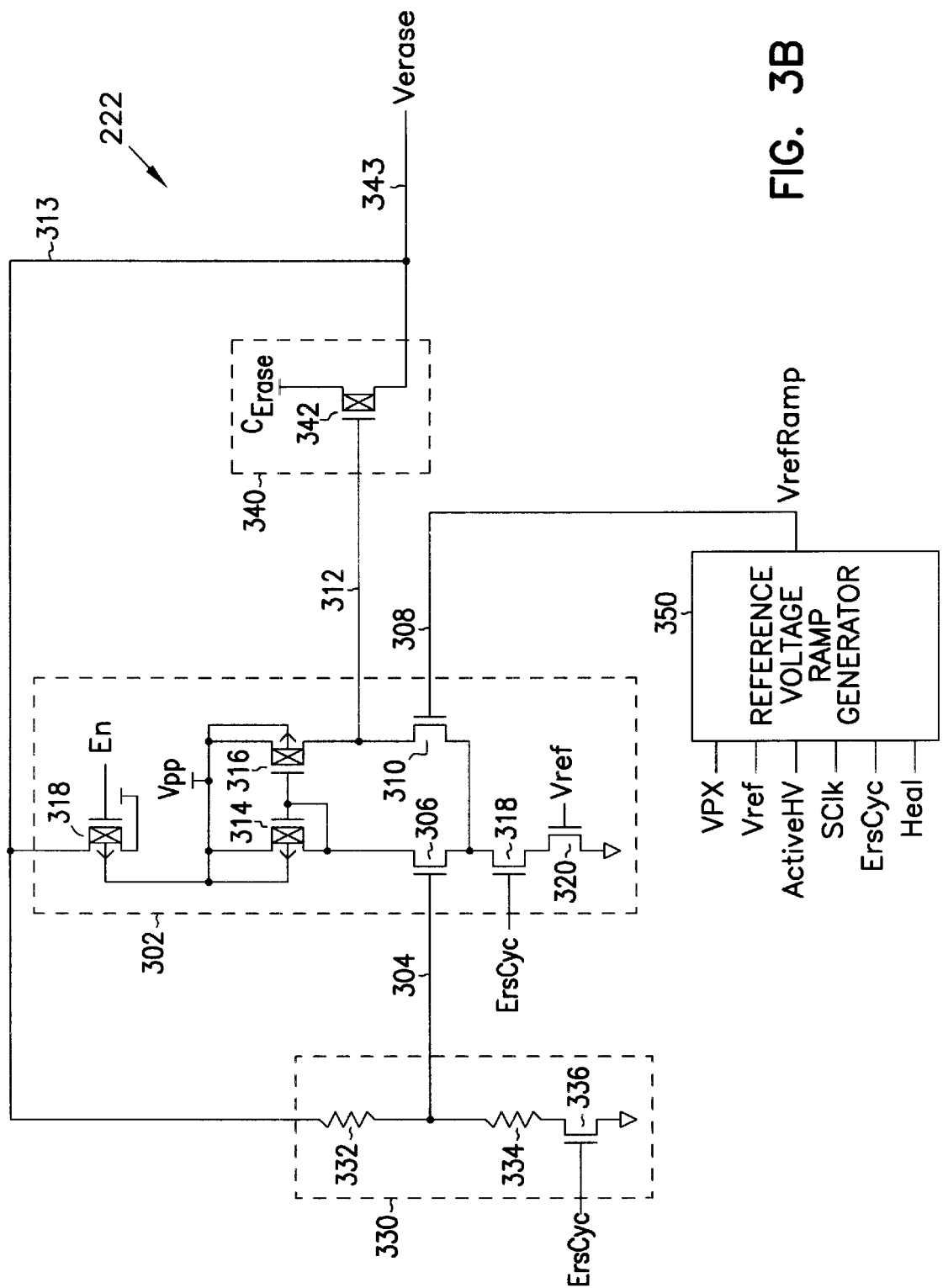
FIG. 3B is a schematic diagram of a source regulation circuit according to the present invention.

FIG. 3B is a schematic diagram of one embodiment of a source regulation circuit 222. Source regulation circuit 222 comprises a differential amplifier 302 which compares inputs 304 and 308 and produces an output 312. The output 312 is used to generate a ramped source erase voltage (Verase) at output 343. The first input 304 of differential amplifier 302 is connected to a resistive network 330, a second input 308 is connected to an output of a reference voltage ramp generator 350. The output 312 of circuit 302 is connected to a switch 340. Switch 340 comprises a P-channel transistor 342 having its drain connected to a source voltage output 343, indicated as Verase, of the source regulation circuit 222. The source of transistor 342 is coupled to Cerase voltage source. Cerase is preferably about 12 volts.

In general, when a voltage on input 308 is greater than a reference voltage on input 304, switch 340 is activated. Thus, the source erase voltage signal (Verase) is activated and controlled by comparing a ramped voltage signal and a reference voltage signal.

Differential amplifier 302 comprises a pair of N-channel transistors 306 and 310 having their gates connected to inputs 304 and 308, respectively. The sources of N-channel transistors 306 and 310 are coupled to the drain of an N-channel transistor 318 which has its gate coupled to receive an Erase Cycle signal, ErsCyc, and its source coupled to an N-channel transistor 320. The ErsCyc signal is an active high signal used to indicate that a memory erase operation is being performed. N-channel transistor 320 is connected to ground at its source while its gate is connected to a reference voltage, indicated as Vref. The value of Vref is preferably about 2 volts. N-channel transistors 306 and 310 are connected to current mirror P-channel transistors 314 and 316. The drain of N-channel transistor 306 is connected to both the gate and drain of P-channel transistor 314. P-channel transistor 316 is coupled to output 312 at its drain. The sources and N-wells of P-channel transistor 314 and 316 are connected to an N-well of P-channel transistor 318. Further, transistors 314 and 316 are coupled to Vpp. P-channel transistor 318 has its source connected to output Verase 343, its drain is connected to a voltage supply, and its gate is connected to an Enable signal (En).

Resistive network 330, functioning as a voltage divider, comprises two series connected resistors 332 and 334. Resistor 332 is connected between input 304 and output Verase 343. Thus, creating a feedback from Verase to node 304 via connection 313. Resistor 334 is connected between input node 304 and ground potential through an N-channel transistor 336. Transistor 336 has a gate connected to receive input signal, ErsCyc. The resistor network produces a reference voltage signal at node 304.

Reference voltage ramp generator 350 produces a ramped voltage signal at output VrefRamp in the range from about 0 to 2 volts. Those skilled in the art will appreciate that these values can be varied without departing from the present invention. The ramped voltage signal at output VrefRamp preferably comprises a plurality of pulses having incrementally increasing amplitudes. Output VrefRamp, provided node 308, is connected to differential amplifier 302. The differential amplifier 302, therefore, activates switch 340 in response to VrefRamp and node 304 to produce a ramped output signal Verase. Transistor 342 is coupled to an erase voltage, Cerase, which establishes the desired upper erase voltage limit. The ramped voltage signal, Verase, is then applied to the sources of flash memory cells which are to be discharged, as identified by controller 201. By ramping the voltage applied to the memory cell source, the invention allows electron tunneling to occur while reducing the current across the oxide due to the slow dv/dt. Consequently, the possibility of hole injection into the oxide is reduced and the reliability of the flash memory is improved. A more detailed description of the operation of source regulation circuit 222 will be described following a description of a reference voltage ramp generator 350 illustrated in FIG. 4.

Figure 4:
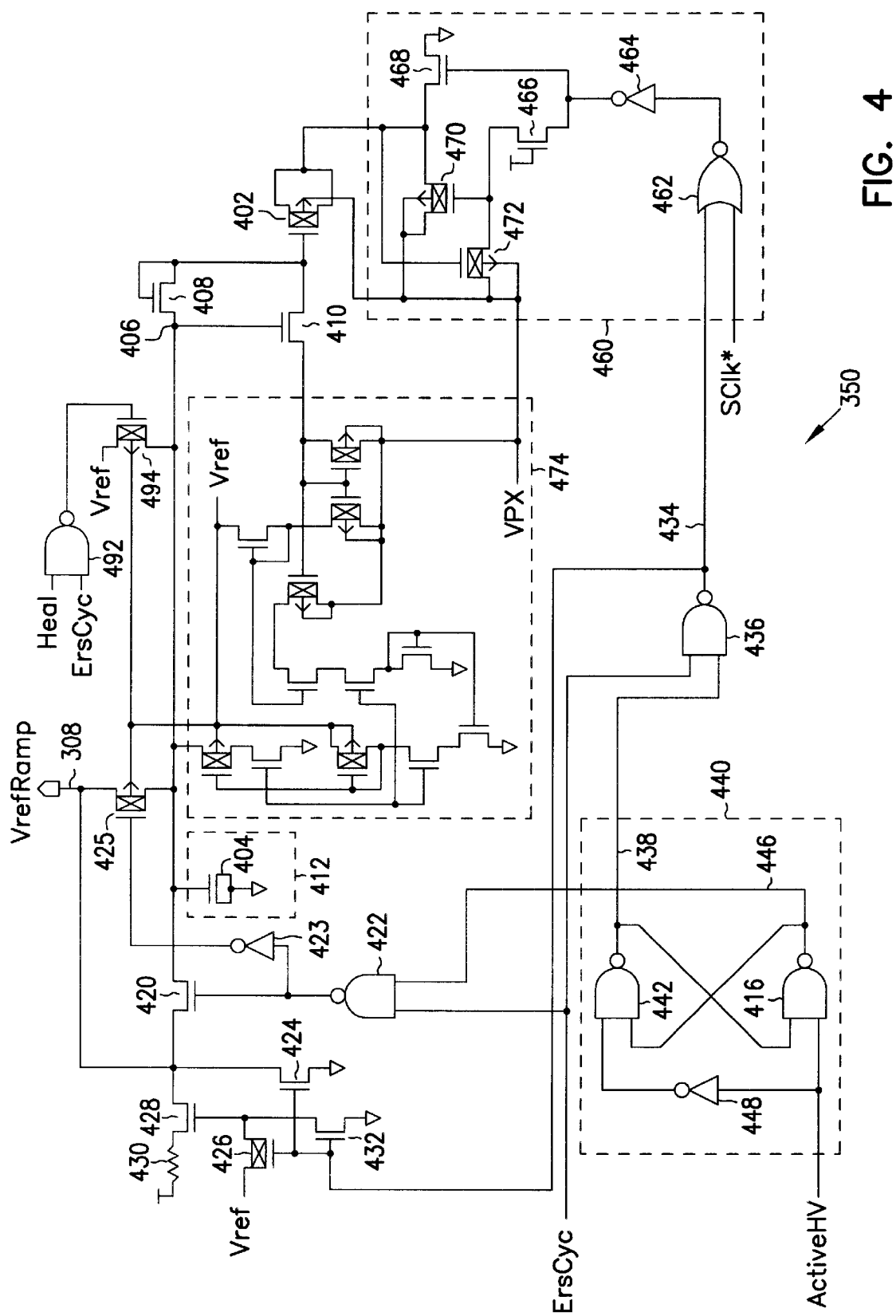
FIG. 4 is a schematic diagram of a reference voltage ramp generator of the source regulation circuit of FIG. 3.

FIG. 4 is a schematic diagram of a reference voltage ramp generator 350 of FIG. 3B used to generate signal VrefRamp at node 308. Ramp generator 350 comprises a pump capacitor 402 connected to node 406 through a diode connected N-channel transistor 408. Capacitor 402 is also connected to the drain of an N-channel transistor 410 which has its gate coupled to node 406. A storage device 412 is connected to node 406. Storage device 412 comprises a storage capacitor 404 connected between node 406 and ground. The size of capacitor 404 is selected to be substantially larger than capacitor 402. Thus, when a charge of capacitor 402 is shared with capacitor 404, the charge on capacitor 404 is only slightly increased. A representative ratio of capacitors 404 to 402 is 50 to 1. Storage capacitor 404 is connected to an output node 308 through a transistors 418 and 425. Output node 308 can be connoted to ground through a pull down transistor 424. Likewise, node 308 can be coupled to Vcc-Vt through transistor 428 and resistor 430. Transistors 432 and 426 are used to selectively activate transistors 428 and 432 in response to node 434.

NAND gate 436 includes a first input coupled to receive the Erase Cycle signal, ErsCyc. A second input of NAND gate 436 is coupled to a first output 438 of a pulse controller circuit 440.

Pulse generator 440 includes cross coupled NAND gates 442 and 416, and inverter 448. The generator operates as an overlapping clock circuit. That is, transistor 420 is off before 424 is turned on to discharge the VrefRamp node to insure that the voltage on the capacitor node 406 is not disturbed.

When the ErsCyc signal and node 438 are high, transistor 426 is activated and transistors 424 and 432 are turned off. Likewise, when either ErsCyc or node 438 are low, transistors 424 and 432 are activated and transistor 426 is turned off. The VrefRamp signal, therefore, is either coupled to ground or an offset voltage provided through transistor 428 and resistor 430 in response to node 434.

Ramp generator 350 further comprises a voltage clamp 474 connected to reference voltage Vref and storage device 412. Voltage clamp 474 is designed to insure that output VrefRamp does not exceed the reference voltage, Vref. As stated above, Vref is preferably about 2 volts.

Output VrefRamp of ramp generator 350 is designed to provide a ramped voltage signal which has a plurality of pulses with incremental amplitudes. The ramped voltage signal is applied to the input of differential amplifier 302 to produce a ramped erase voltage signal at output Verase of source regulation circuit 222. The operation of source regulation circuit 222 is described in detail below with reference to FIG. 5.

Figure 5:
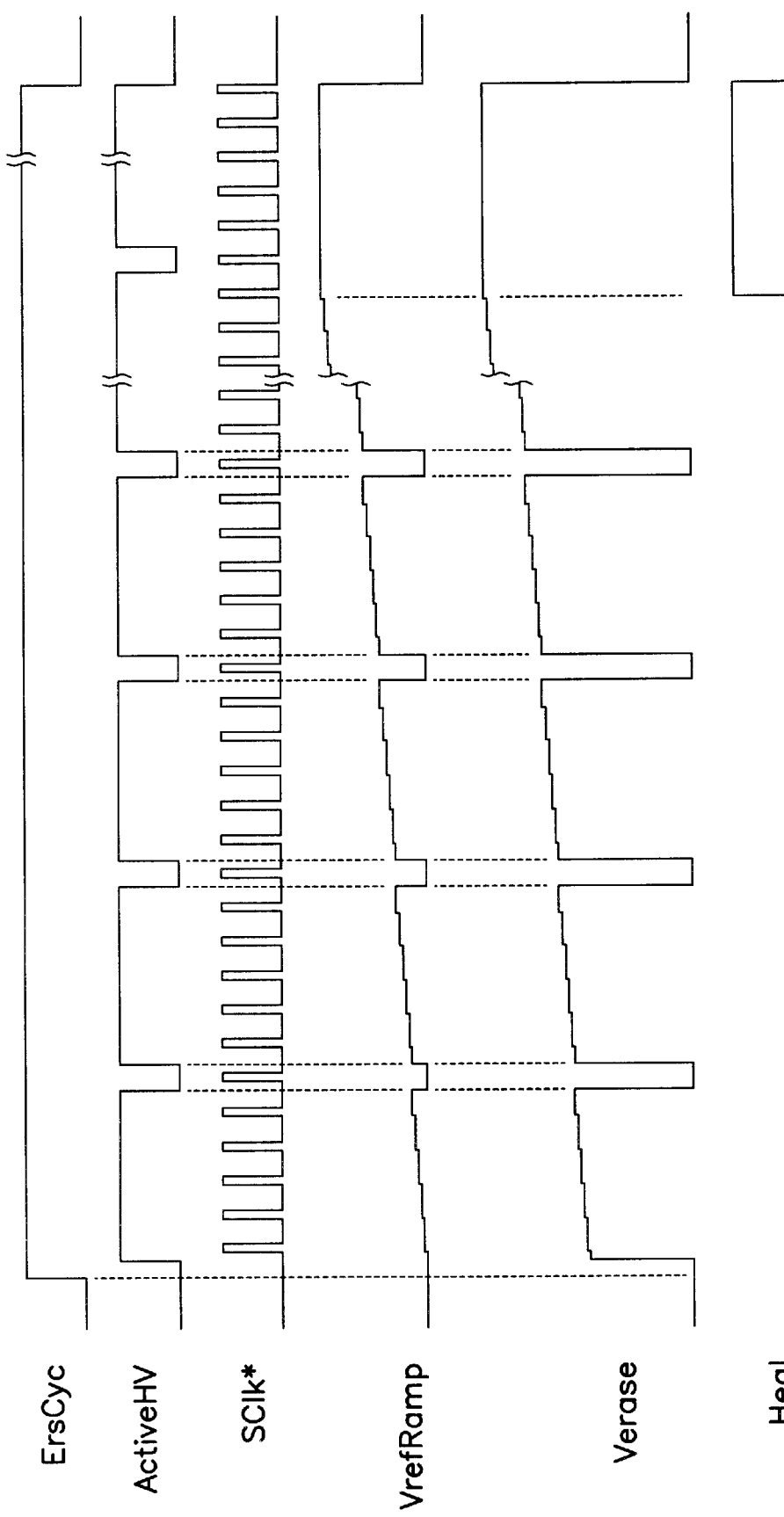
FIG. 5 is a timing diagram of the source regulation circuit of FIG. 3.

Referring to FIG. 5, during an erase operation, the source of the floating gate memory cell is coupled to signal Verase which comprises short ramped pulses. Erase Cycle signal ErsCyc goes high to enable an erase operation.

Referring to FIGS. 3–5, when the Erase Cycle signal (Erscyc) is low the output of NAND gate 436 is high. The ramp generator, therefore, is disabled. When Erscyc is high, the ramp generator is enabled and the output of NAND gate 436 is dependant upon the ActiveHV signal. As stated above, output 438 of the pulse controller is high when the ActiveHV signal is high. Thus, when the ActiveHV signal is high, the output node 308 is coupled to Vref-Vt through transistor 428 and resistor 430 (assuming Vref turns transistor 428 on). This voltage connection is optional, but provides an offset for amplifier 302 to eliminate a slow ramp rate when node 308 is below a Vt of transistor 310. Further, the output of NAND gate 422 is high when the ActiveHV signal is high. Thus, node 308 is also coupled to capacitor 404 when the ActiveHV signal is high. When the ActiveHV signal is low, transistors 420, 425 and 426 are turned off, and transistors 432 and 424 are activated to couple node 308 to ground potential. The present invention allows a slower ramp rates than would be available in conventional memories. Conventional memory devices would require a ramped voltage to be initiated and completed within a short erase pulse. The voltage, therefore, would have a very fast ramp rate. Conversely, the present invention distributes the ramp over several short pulses by maintaining an offset which allows the erase voltage to begin at a voltage level where the last pulse finished. For example, during a first erase pulse the erase voltage can ramp from an initial voltage of V1 to V2, and then on a subsequent pulse the erase voltage will ramp from an initial voltage of V2 to V3. It is understood that if an erase voltage which is to ramp from V1 to V3 in a single pulse would require a much faster ramp rate.

The current limiting small pump 460 charges capacitor 402 while the Slow Clock (Sclk*) signal is high and node 434 is low. Because the ramp rate of VrefRamp is intended to be slow, Slow Clock operates at about 400 µs/cycle, but variations are anticipated. Thus, the charge on capacitor 404 is increased slightly upon each Sclk* cycle while ActiveHV is high. As stated above, the ratios of the capacitors are selected so that capacitor 404 is greater than capacitor 402. In summary, when the ActiveHV signal is low, output node 308 is coupled to ground. When ActiveHV is high, node 308 is coupled to a controlled ramp voltage. The VPX supply is an internal supply which is regulated to be independent of changes in Vcc. This is an optional supply, but its use results in a more accurate system.

NAND gate 492 and transistor 494 are provided to speed the erase procedure during low current discharge operations. That is, after the floating gate of the memory cells is substantially discharged, the current through the gate oxide is low and the risk of oxide damage is reduced. Further, a Heal signal can be activated following an erase operation to insure that the memory cells were not over erased. A high Heal signal activates transistor 494 when the ErsCyc is high. The output node 308 is then pulled high to its maximum upper limit, Vref. This accelerated erase period is optional, but a preferred compromise between maintaining a fast erase process while protecting the gate oxide layer.

Figures 6A, 6B:
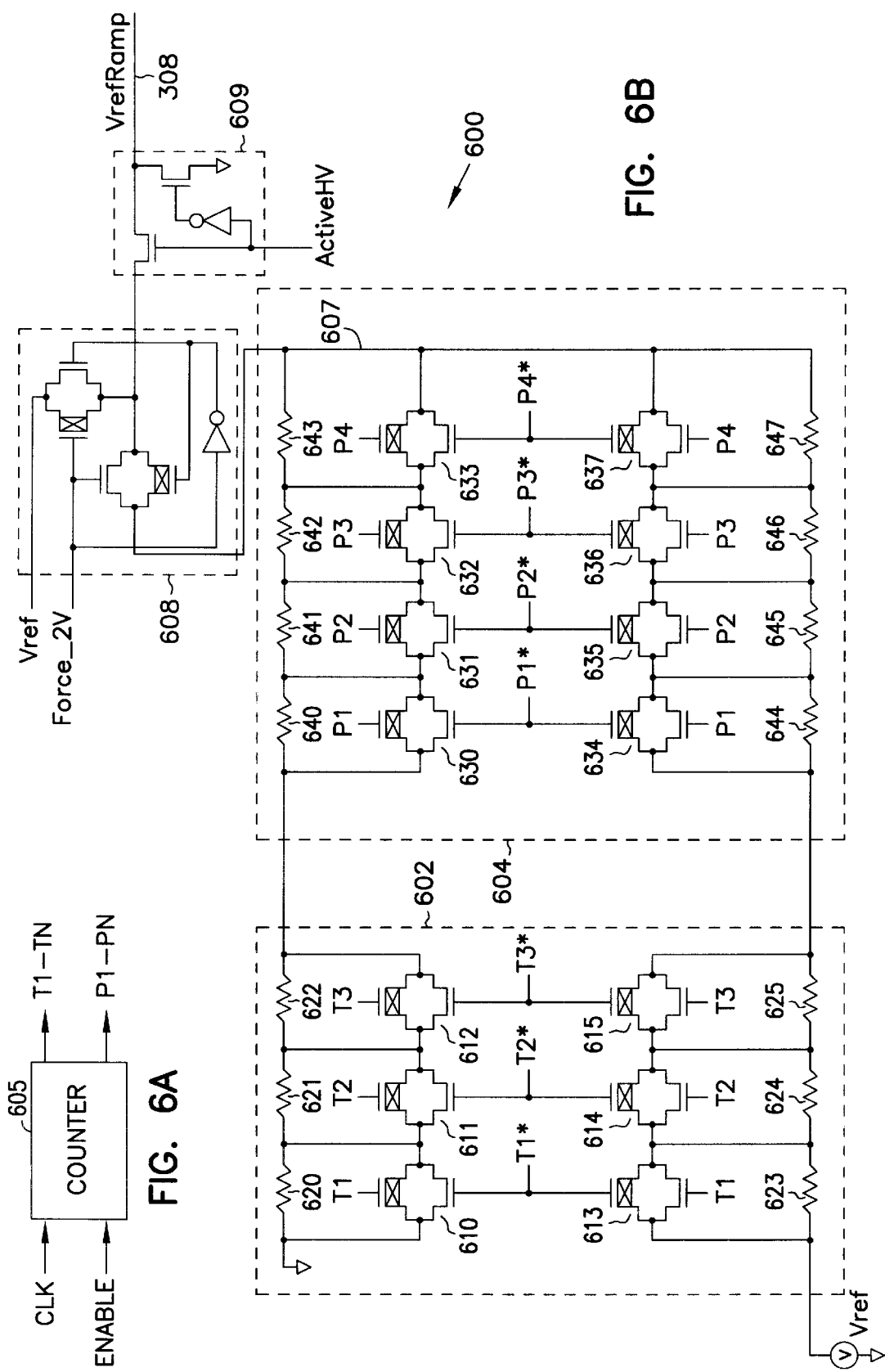
FIG. 6A is a block diagram of a counter circuit.
FIG. 6B is an alternate embodiment of the reference voltage ramp generator of FIG. 3.

The above described ramp generator is analog based using a charge sharing capacitor circuit and a controlled charging system. An alternate embodiment of ramp generator 350 of FIG. 3B is illustrated in FIG. 6B. The circuit in FIG. 6B, however, is a digital version of ramp generator 350. In particular, a digital ramp generator 600 comprises a timer counter 602 for adjusting an output voltage during an erase pulse and a pulse counter 604 for offsetting the output voltage during successive erase pulses. Timing and Pulse counters are connected to an output signal VrefRamp through a bypass circuit 608. In general, a counter 605 (FIG. 6A) is included in the memory to produce timing outputs T1–Tn and pulse outputs P1–PN. These outputs are used to generate output signal VrefRamp on node 308. It will be understood that the number of timing outputs T1–Tn can is selected depending upon the desired number of steps per pulse, and the number of pulse outputs P1–Pn is selected based upon the desired number of pulses per erase cycle. In the preferred embodiment, counter 605 is already included in the memory circuit and can be shared to eliminate the need for the addition of a new counter circuit.

The digital ramp generator 600 operates as a variable voltage divider circuit having resistors 620–622 and 640–643 connected between node 607 and ground, and resistors 623–625 and 644–647 connected between Vref and node 607. Again, Vref is a reference voltage of preferably about 2 volts. Each of the resistors is connected in parallel with a pair of bypass transistors. For example, resistor 620 is connected to bypass transistors 610. These bypass transistors are coupled to receive the outputs of counter 605. By selectively activating the bypass transistors the voltage at node 607 can be ramped in a controlled fashion. Each branch of the ladder has equal resistance. That is, resistor 620 and 623 are fabricated to have equal resistance, likewise resistors 621 and 624 are equal. Further, resistor 624 has twice the resistance of resistor 623, and resistor 625 has twice the resistance of resistor 624. This allows the resistor to act as a binary weighted resistor ladder.

Figure 7:
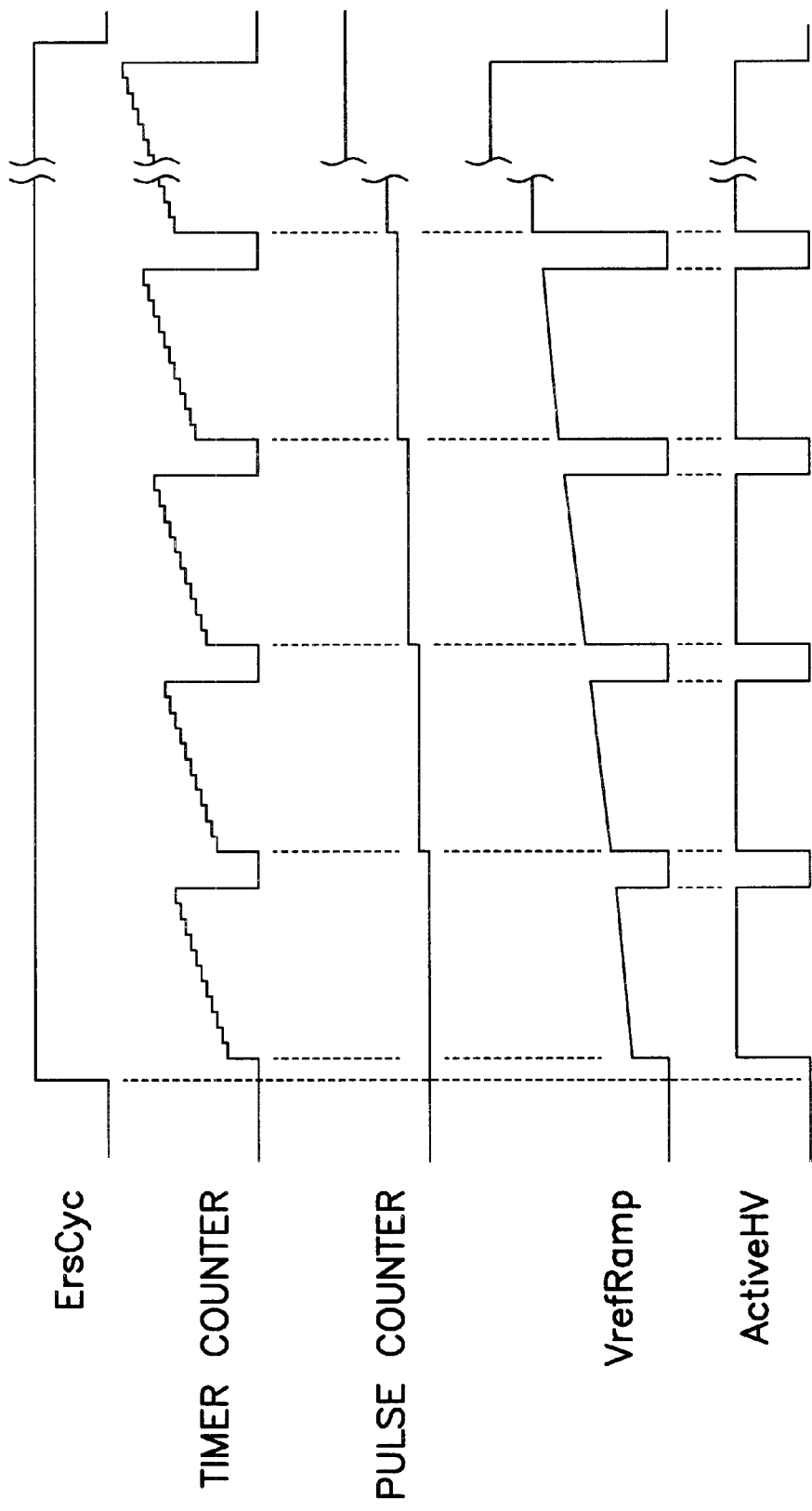
FIG. 7 is a timing diagram of the reference voltage ramp generator of FIG. 6B.

FIG. 7 illustrates the operation of ramp generator 600. During an erase cycle (ErsCyc signal high) the voltage at node 607 is increased in a ramped fashion in response to the timer circuit 602. It will be understood that the diagram of FIG. 7 is an illustration of the portion of the output signal produced by the timer circuit, and is not the actual output signal at node 607. After the timer counter has fully incremented, the pulse counter is incremented to add an offset voltage to node 607. The offset voltage is illustrated by the pulse counter signal of FIG. 7. It will be understood that the diagram of FIG. 7 is an illustration of the portion of the output signal produced by the counter circuit, and is not the actual output signal at node 607. The sum of the voltages generated by the timer and pulse counter circuits produce the actual output signal on node 308. Because the resistors in each branch are equal, and bypassed in opposite fashions, the current through the resistors will stay constant. That is, resistor 623 will be bypassed when resistor 320 is not bypassed. Since Vref is maintained at a very stable level, and variations in resistance between resistors is low, the voltage at node 607 is very precisely controlled.

Optional circuit 609 is provided to isolate node 308 from ramp generator 600 and couple node 308 to ground when the ActiveHV signal is low. This feature allows VrefRamp to be broken into pulses to avoid over erasure of the memory cells. The counter circuit 605 can be inhibited during a low ActiveHV signal to prohibit incrementing the ramp generator circuit.

Bypass circuit 608 is designed for the same purpose as the Heal operation in ramp generator 350 of FIG. 4. That is, the ramp generator 600 can be bypassed to speed the discharge of memory cells, for fast erase operations, or to heal erased memory cells.

CONCLUSION

A flash memory comprising floating gate memory cells and a source regulation circuit is described. The source regulation circuit is used to produce a controlled ramped voltage signal. During an erase operation, the ramped voltage signal is applied to the sources of the floating gate memory cells. By ramping the voltage coupled to the sources, a controlled discharge of the memory cell is allowed, while damage to the gate oxide of the floating gate memory cells is reduced. As a result, the durability of the oxide and the reliability of the flash memory are both increased.

It is to be understood that the above description is intended to be illustrative, and not restrictive. Many other embodiments will be apparent to those of skill in the art upon reviewing the above description. The scope of the invention should, therefore, be determined with reference to appended claims, along with the full scope of equivalents to which such claims are entitled.

What is claimed is:

1. A processing system comprising:
   a processor;
   a memory device having floating gate transistor memory cells comprising;
      data communication lines connecting between the memory device and the processor for bidirectional data communication between the processor and the memory device;
      address lines connecting from the processor to the memory device for providing memory cell addresses of the memory device;
      control lines connecting between the memory device and the processor for providing control signals from the processor to the memory device for controlling memory functions, the memory functions including an erase memory cell function; and
      a source regulation circuit for producing a ramped voltage signal during the erase memory cell function and coupling the ramped voltage signal to a source connection of memory cells identified for erasure.

2. A processing system comprising:
   a processor;
   a memory device connected to the processor and having floating gate transistor memory cells comprising:
      an array of floating gate memory cell transistors;
      a control circuit for storing a charge on the floating gate memory cell transistors during a programming operation, and removing the stored charge from the floating gate memory cell transistors during an erase operation; and
      a source regulation circuit for applying a ramped voltage signal to sources of the floating gate memory cell transistors during the erase operation.

3. A computer processing system comprising:
   a computer processor;
   a memory device connected to communicate with the computer processor and having floating gate transistor memory cells comprising:
      an array of floating gate memory cell transistors;
      a control circuit coupled to the array of floating gate memory cell transistors, for storing a charge on the floating gate memory cell transistors during a programming operation, and removing the stored charge from the floating gate memory cell transistors during an erase operation; and
      a source regulation circuit coupled to the array of floating gate memory cell transistors, for applying a ramped voltage signal to sources of the floating gate memory cell transistors during said erase operation,
   wherein the source regulation circuit comprises:
      a ramp generator for producing a ramped output voltage signal on an output node;
      a reference circuit for producing a reference voltage;
      a comparator circuit for comparing the ramped output voltage signal and the reference voltage, the comparator circuit having an output for providing an output signal in response to the ramped output voltage signal and the reference voltage; and
      an output circuit for producing the ramped voltage signal applied to the sources of the floating gate memory cell transistors.

4. The computer processing system according to claim 3 wherein the ramped voltage signal is a series of ramped voltage pulses, and wherein a first ramped voltage pulse begins at a first voltage and ramps to a second voltage, and a second subsequent ramped voltage pulse begins at the second voltage and ramps to a third voltage.

5. The computer processing system according to claim 3 wherein the ramped voltage signal begins at a first voltage and ramps up to a final voltage.

6. A processing system comprising:
   a processor;
   a memory device connected to the processor, comprising:
      an array of floating gate memory cell transistors;
      a control circuit coupled to the array of floating gate memory cell transistors, for storing a charge on the floating gate memory cell transistors during a programming operation, and removing the stored charge from the floating gate memory cell transistors during an erase operation; and
      a source regulation circuit coupled to the array of floating gate memory cell transistors, for applying a ramped voltage signal to sources of the floating gate memory cell transistors during said erase operation,
   wherein the source regulation circuit comprising:
      a differential amplifier;
      a resistor divider circuit connected to the differential amplifier, the resistor divider circuit producing a reference voltage;
      an analog ramp generator circuit connected to the differential amplifier for producing a ramped output voltage signal; and
      an output circuit for producing the ramped voltage signal applied to the sources of the floating gate memory cell transistors.

7. The processing system according to claim 6 wherein the analog ramp generator circuit comprises:
   a first coupling circuit for coupling an output node to ground potential in response to a first state of an input signal;
   charge sharing circuitry for generating the ramped output voltage signal in response to a clock signal;
   a second coupling circuit for coupling the output node to the ramped output voltage signal in response to a second state of the input signal.

8. The processing system of claim 7 wherein the analog ramp generator circuit further comprises a bypass circuit coupled to the output node and a second reference voltage and having an input wherein the bypass circuit couples the output node to the second reference voltage in response to a signal on the input.

9. A computer processing system comprising:
a computer processor;
a flash memory device connected to communicate with the computer processor and comprising:
  an array of floating gate memory cell transistors;
  a control circuit coupled to the array of floating gate memory cell transistors, for storing a charge on the floating gate memory cell transistors during a programming operation, and removing the stored charge from the floating gate memory cell transistors during an erase operation; and
  a source regulation circuit coupled to the array of floating gate memory cell transistors, for applying a ramped voltage signal to sources of the floating gate memory cell transistors during said erase operation, wherein the source regulation circuit comprising:
    a differential amplifier;
    a resistor divider circuit connected to the differential amplifier, the resistor divider circuit producing a reference voltage;
    a digital ramp generator circuit connected to the amplifier for producing a ramped output voltage signal; and
    an output circuit for producing the ramped voltage signal applied to the sources of the floating gate memory cell transistors.

10. The computer processing system according to claim 9 wherein the digital ramp generator circuit comprises:
  a counter circuit connected to receive a clock signal and produce an incremented output in response to the clock signal; and
  a variable voltage divider circuit connected to the counter circuit for producing the ramped output voltage signal.

11. The computer processing system according to claim 10 wherein an amplitude of the ramped output voltage signal increases as the output of the counter circuit is incremented.

12. A computing system comprising:
a computer processor;
a memory device connected to communicate with the computer processor and having floating gate transistor memory cells comprising:
  a memory array of floating gate memory cell transistors;
  a differential amplifier having first and second inputs and an output;
  a voltage divider circuit connected to the first input of the differential amplifier for providing a variable reference voltage;
  a voltage ramp generator having an output connected to the second input of the differential amplifier for providing a ramped reference voltage signal; and
  an output circuit connected to the output of the differential amplifier for providing a ramped voltage signal to be coupled to sources of the floating gate memory cell transistors during an erase operation.

13. The computing system of claim 12 wherein the voltage ramp generator is an analog circuit comprising:
  a charging circuit coupled to a capacitor, the charging circuit incrementally increases the charge on the capacitor in response to a clock signal; and
  coupling circuitry connected to the output of the voltage ramp generator and the capacitor for selectively coupling the capacitor to the output.

14. The computing system of claim 13 wherein the voltage ramp generator further comprises a second coupling circuit connected to the output of the voltage ramp generator to selectively couple the output to ground potential.

15. The computing system of claim 12 wherein the voltage ramp generator is a digital circuit comprising:
  a counter circuit for providing a plurality of outputs; and
  a variable resistance voltage divider circuit coupled to the counter circuit for providing the ramped reference voltage signal.

16. The computing system claim 15 wherein the variable resistance voltage divider circuit comprises a plurality of resistors each connected in parallel with a bypass transistor, the bypass transistor having a gate coupled to one of the plurality of outputs of the counter circuit.

17. The computing system of claim 12 wherein the ramped reference voltage signal is a series of ramped voltage pulses, and wherein a first ramped voltage pulse begins at a first voltage and ramps to a second voltage, and a second subsequent ramped voltage pulse begins at the second voltage and ramps to a third voltage.

18. A computer processing system comprising:
a computer processor;
a floating gate memory device connected to communicate with the computer processor and having a source regulation circuit for use in the floating gate memory device and having floating gate memory cell transistors having sources, comprising:
  a ramp generator for producing a ramped output voltage signal on an output node;
  a reference circuit coupled to the ramp generator, for producing a reference voltage;
  a comparator circuit coupled to the ramp generator and the reference circuit, for comparing the ramped output voltage signal and the reference voltage, the comparator circuit having an output for providing an output signal in response to the ramped output voltage signal and the reference voltage; and
  an output circuit coupled to the comparator circuit, for producing a ramped voltage signal applied to the sources of the floating gate memory cell transistors.

19. The computer processing system circuit of claim 18 wherein the source regulation circuit further comprises:
  a differential amplifier;
  a resistor divider circuit connected to the differential amplifier, the resistor divider circuit producing the reference voltage; and
  an analog ramp generator circuit connected to the amplifier for producing the ramped output voltage signal.

20. The computer processing system of claim 19 wherein the source regulation circuit further comprises:
  a differential amplifier;
  a resistor divider circuit connected to the differential amplifier, the resistor divider circuit producing the reference voltage; and
  a digital ramp generator circuit connected to the amplifier for producing the ramped output voltage signal.

* * * * *

UNITED STATES PATENT AND TRADEMARK OFFICE
CERTIFICATE OF CORRECTION

PATENT NO. : 6,529,417 B2
DATED : March 4, 2003
INVENTOR(S) : Roohparvar

It is certified that error appears in the above-identified patent and that said Letters Patent is hereby corrected as shown below:

<u>Title page,</u>
Item [62], Related U.S. Application Data, delete "6,097,632" and insert -- 6,087,632 --, therefor.

<u>Column 1,</u>
Line 7, delete "6,097,632" and insert -- 6,087,632 --, therefor.

<u>Column 6,</u>
Line 37, delete "connoted" and insert -- connected --, therefor.

<u>Column 8,</u>
Line 13, delete "is" and insert -- be --, therefor.

<u>Column 12,</u>
Line 14, insert -- of -- after "system".

Signed and Sealed this

Third Day of February, 2004

JON W. DUDAS
*Acting Director of the United States Patent and Trademark Office*